United States Patent [19]

Kobatake

[11] Patent Number: 5,173,874

[45] Date of Patent: Dec. 22, 1992

[54] SEMICONDUCTOR STORAGE DEVICE

[75] Inventor: Hiroyuki Kobatake, Tokyo, Japan

[73] Assignee: NEC Corporation, Tokyo, Japan

[21] Appl. No.: 729,737

[22] Filed: Jul. 15, 1991

[30] Foreign Application Priority Data

Jul. 13, 1990 [JP] Japan .................. 2-186043

[51] Int. Cl.[5] ............... G11C 7/00; G11C 11/34
[52] U.S. Cl. .................. 365/185; 365/189.09
[58] Field of Search .......... 365/185, 189.09, 189.01

[56] References Cited

U.S. PATENT DOCUMENTS

| | | | |
|---|---|---|---|
| 4,597,062 | 6/1986 | Asano et al. | 365/185 X |
| 4,910,710 | 3/1990 | Kobatake | 365/189.01 |
| 4,924,438 | 5/1990 | Kobatake | 365/189.09 X |
| 4,937,787 | 6/1990 | Kobatake | 365/185 X |
| 4,979,146 | 12/1990 | Yokayama et al. | 365/185 |

Primary Examiner—Eugene R. LaRoche
Assistant Examiner—Do Hyun Yoo
Attorney, Agent, or Firm—Whitham & Marhoefer

[57] ABSTRACT

In writing data in a selected memory cell in an EPROM, MOSFETs constituting a write circuit are controlled by a reference voltage and an output from a voltage dividing circuit in accordance with a write data so that the limited voltage and the limited current of the load line used can be set as desired. This prevents an excess current from being supplied to the drain electrode of a memory cell so that the EPROM can be fabricated without deteriorating the reliability of the memory cell. Further, the wirings for connecting a write voltage terminal with the write circuit and the voltage dividing circuit are individually provided so that the width of the wirings, i.e., the wiring area in the EPROM can be reduced. This permits the EPROM to be integrated with high density.

7 Claims, 7 Drawing Sheets

SEMICONDUCTOR STORAGE DEVICE

BACKGROUND OF THE INVENTION (1) Field of the invention

The present invention relates to a semiconductor storage device and, more particularly, to an electrically erasable programmable read-only memory (hereinafter referred to as "EPROM").

(2) Description of the prior art

Figure 1:
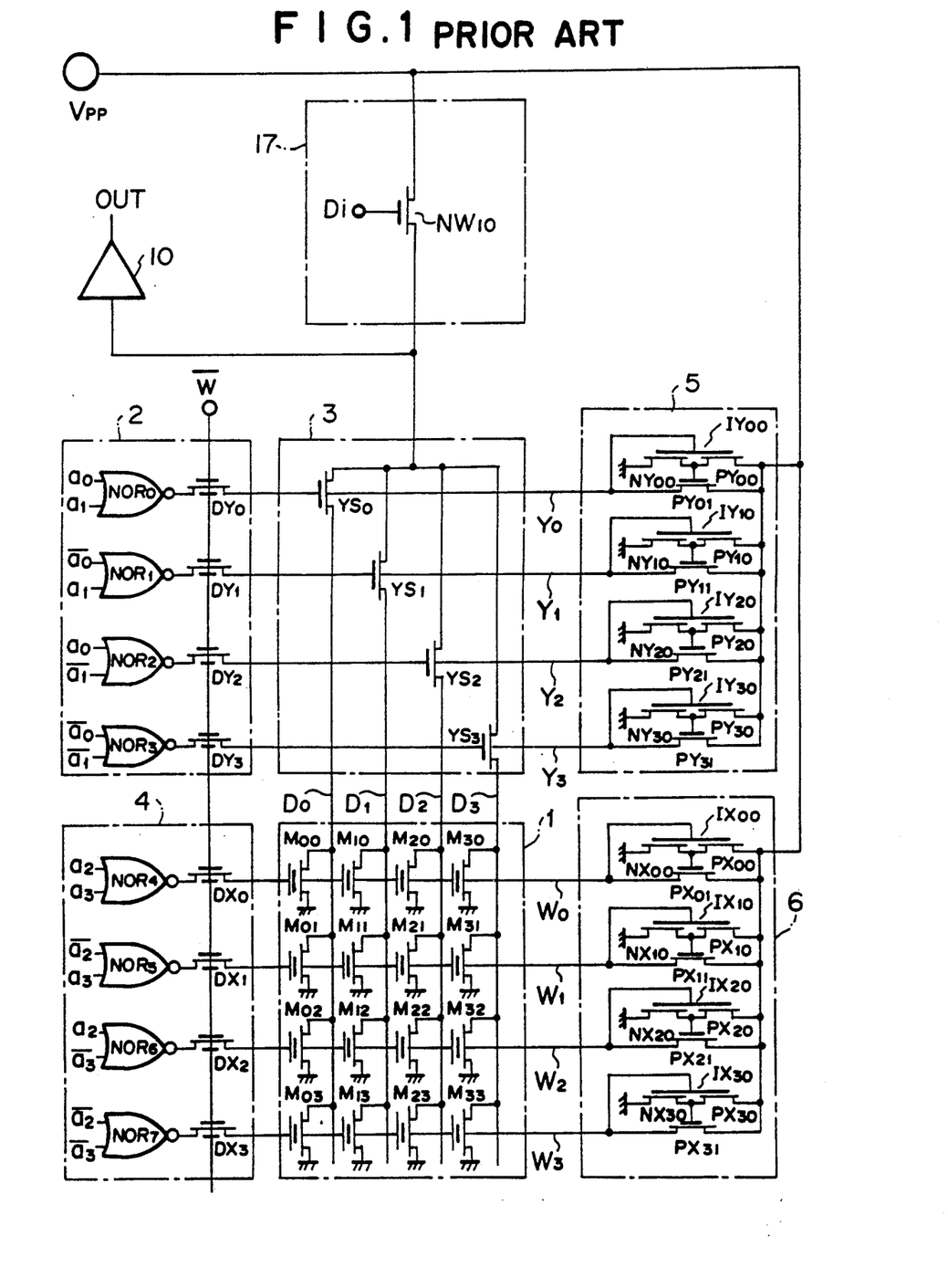
FIGS. 1 and 2 are circuit diagrams of prior art EPROMs, respectively.

The prior art EPROM of the kind to which the present invention relates is, as shown in FIG. 1, composed of a memory cell array 1, a plurality of column lines $D_0$–$D_3$, a plurality of row lines $W_0$–$W_3$, a column decoder 2, a column selector 3, a row decoder 4, a column pull-up circuit 5, a row pull-up circuit 6, a write circuit 17 and a sense amplifier 10.

Specifically, the memory cell array 1 comprises a plurality of electrically erasable programmable memory cells $M_{00}$–$M_{33}$ each having a floating gate arranged in a matrix form, that is, in a row and a column direction. The column lines $D_0$–$D_3$ serve to connect the memory cells $M_{00}$–$M_{33}$ in the column direction. The row lines $W_0$–$W_3$ serve to connect the memory cells $M_{00}$–$M_{33}$ in the row direction. The column decoder 2 is composed of NOR gates $NOR_0$–$NOR_3$ having inputs of address signals $a_0$–$\overline{a_1}$, and transfer gates constituted by N-channel depletion type MOS field effect transistors (hereinafter referred to as "MOSFETs") $DY_0$–$DY_3$ to each of the gates of which a write signal $\overline{W}$ is commonly applied. The column selector 3 is composed of N-channel MOSFETs $YS_0$–$YS_3$ which are driven by the outputs $Y_0$–$Y_3$ from the column decoder 2 and serve to select the column lines $D_0$–$D_3$. The row decoder 4 is composed of NOR gates $NOR_4$–$NOR_7$ having inputs of address signals $a_2$–$\overline{a_3}$, and transfer gates constituted by N-channel depletion type MOSFETs $DX_0$–$DX_3$ to each of the gates of which a write signal $\overline{W}$ is commonly applied, and serve to select the row lines $W_0$–$W_3$. The column pull-up circuit 5 is composed of inverters $IY_{00}$–$IY_{30}$ and P-channel MOSFETs $PY_{01}$–$PY_{31}$. The inverters $IY_{00}$–$IY_{30}$ comprise P-channel MOSFETs $PY_{01}$–$PY_{31}$ and N-channel MOSFETs $NY_{00}$–$NY_{30}$ which are connected in series between a write voltage terminal $V_{PP}$ and ground, and their inputs are connected with the outputs $Y_0$–$Y_3$ from the column decoder 2. The P-channel MOSFETs $PY_{00}$–$PY_{30}$ are connected between the write voltage terminal $V_{PP}$ and the outputs $Y_0$–$Y_3$ from the column decoder 2, and applied to their gate electrodes are the outputs from the inverters $IY_{00}$–$IY_{30}$. The row pull-up circuit 6 is composed of inverters $IX_{00}$–$IX_{30}$ and P-channel MOSFETs $PX_{01}$–$PX_{31}$. The inverters $IX_{00}$–$IX_{30}$ comprise P-channel MOSFETs $PX_{00}$–$PX_{30}$ and N-channel MOSFETs $NX_{00}$–$NX_{30}$ which are connected in series between the write voltage terminal $V_{PP}$ and the ground, and their inputs are connected with the row lines $W_0$–$W_3$. The P-channel MOSFETs $PX_{01}$–$PX_{31}$ are connected between the write voltage terminal $V_{PP}$ and the row lines $W_0$–$W_3$, and applied to their gate electrodes are the outputs from the inverters $IX_{00}$–$IX_{30}$. The write circuit 17 is constituted by an N-channel MOSFET $NW_{10}$ which is connected between the write voltage terminal $V_{PP}$ and the column selector 3 and to the gate electrode of which a write data $D_1$ is applied. The sense amplifier 10 serves to read the data stored in the memory cells $M_{00}$–$M_{33}$.

The operation of the EPROM of FIG. 1 will be described below.

First, the write operation will be explained. With the write voltage terminal $V_{PP}$ set for a high voltage (e.g., 12.5 V) and the write signal $\overline{W}$ set for a low level (0 V), address signals corresponding to the memory cell in which a data is to be stored are applied. For example, if $a_0=0$, $a_1=0$, $a_2=0$, and $a_3=0$, in the column decoder 2, $NOR_0$ is selected so that it produces a high level 5 V, whereas $NOR_1$ to $NOR_3$ are not selected so that they produce a low level 0 V. Now it is assumed that the threshold voltage (hereinafter referred to as "$V_T$") of each of the N-channel MOSFETs $DY_0$–$DY_3$ is, for example, $-3$ V. Since the low level 0 V is applied to the gates of $DY_0$–$DY_3$, the selected column decoder output $Y_0$ is charged up to $|V_{TD}|=3$ V through the N-channel MOSFET $DY_0$ so that $DY_0$ is in a cut off state. On the other hand, the non-selected column decoder outputs $Y_1$–$Y_3$ become the low level 0 V through the MOSFETs $DY_1$–$DY_3$. Then, if the logical threshold voltage of the inverters $IY_{00}$–$IY_{30}$ in the column pull-up circuit 5 is set for the voltage lower than $|V_{TD}|=3$ V, the output from the inverter $IY_{00}$ becomes the low level 0 V. Therefore, the P-channel MOSFET $PY_{01}$ turns on so that the selected column decoder output $Y_0$ is pulled up to the high voltage $V_{PP}=12.5$ V through the P-channel MOSFET $PY_{01}$. On the other hand, the outputs from the inverters $IY_{10}$ to $IY_{30}$ are the high level 12.5 V so that the P-channel MOSFETs $PY_{11}$ to $PY_{31}$ turn off. Thus, the low level 0 V of the non-selected column decoder outputs $Y_1$ to $Y_3$ are not influenced. In this state, only the N-channel MOSFET $YS_0$ constituting a part of the column selector 3 turns on so that the write circuit 17 is connected with the column line $D_0$ through the MOSFET $YS_0$. Further, the row decoder 4 and the row pull-up circuit 6, which have the same circuit arrangements as the column decoder 2 and the column pull-up circuit 5, respectively, select the row line $W_0$ to be pulled up to the high voltage 12.5 V while the non-selected $W_1$ to $W_3$ are at the low level 0 V.

In this way, the memory cell $M_{00}$ is selected. The selected memory cell $M_{00}$ is connected with the write circuit 17 through the N-channel MOSFET $YS_0$ in the column selector 3.

Figure 3A:
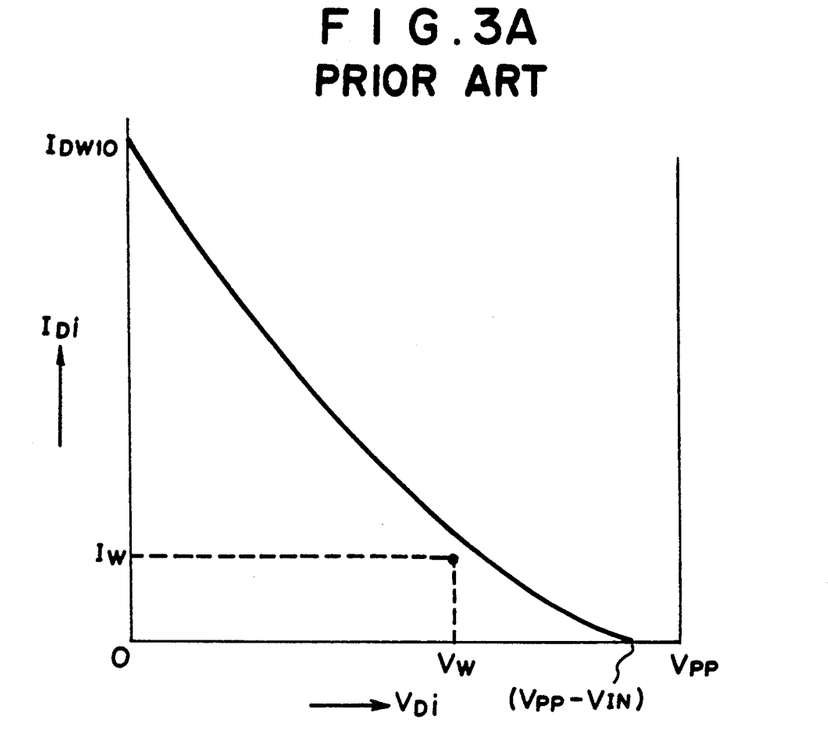
FIGS. 3A and 3B are graphs showing the characteristics of load lines in the EPROMs shown in FIGS. 1 and 2, respectively.

Now, if the write data $D_1$ is the high level $V_{PP}=12.5$ V, the N-channel MOSFET $NW_{10}$ turns on so that the drain electrode of the memory cell $M_{00}$ is connected with the write voltage terminal $V_{pp}$ through the N-channel MOSFET $NW_{10}$ constituting the write circuit 17 and the N-channel MOSFET $YS_0$ in the column selector 3. Thus, the threshold voltage $V_{TM}$ of the memory cell $M_{00}$ is shifted from $V_{TM}=2$ V to $V_{TM}=10$ V. The load line obtained with the potential $V_{D1}$ at the selected column and the current $I_{D1}$ flowing through the MOSFET $NW_{10}$ in the write circuit 17 and the MOSFET $YS_0$ in the column selector 3 is shown in FIG. 3A. Since $V_{PP}=12.5$ V is previously applied to the gates of the MOSFET $NW_{10}$ and the MOSFET $YS_0$, $I_{D1}$ flows when $V_{D1}<(V_{PP}-V_{TN})$ ($V_{TN}$ represents the threshold voltage of the MOSFET $NW_{10}$ and the MOSFET $YS_0$); the lower the voltage $V_{D1}$, the larger the current $I_{D1}$. In order to shift the threshold voltage $V_{TM}$ of the memory cell $M_{00}$, the load line must be set at the upper right of a write starting point (represented by "." on the graph) given by $V_W$ and $I_w$.

On the other hand, the write data $D_1$ is the low level 0 V, the MOSFET $NW_{10}$ in the write circuit 17 turns off so that no voltage is applied to the drain electrode of the selected memory cell. Thus, the selected memory cell $M_{00}$ is in a non-writing state so that the $V_{TM}$ is not shifted but maintains e.g., $V_{TM}=2$ V.

Next, the read operation will be explained. With the write voltage terminal $V_{PP}$ set for a power supply voltage $V_{CC}=5$ V and the write signal $\overline{W}$ set for a high level (5 V), address signals corresponding to the memory cell from which a data is to be read out are applied. For example, if $a_0=0$, $a_1=0$, $a_2=0$, and $a_3=0$, in the column decoder 2, $NOR_0$ is selected so that it produces a high level 5 V, whereas $NOR_1$ to $NOR_3$ are not selected so that they produce a low level 0 V. Since the high level 5 V has been applied to each of the gates of the MOSFET $DY_0$-$DY_3$, the selected column decoder output $Y_0$ is the high level, whereas the non-selected column decoder outputs $Y_1$-$Y_3$ are the low level 0 V. In the column pull-up circuit 5, the output from the inverter $IY_{00}$ becomes the low level 0 V so that the P-channel MOSFET $PY_{01}$ turns on. Thus, the selected column decoder output $Y_0$ is pulled up to the high level voltage $V_{CC}=5$ V also through the MOSFET $PY_{01}$. On the other hand, the outputs from the inverters $IY_{10}$ to $IY_{30}$ are the high level $V_{CC}=5$ V so that the P-channel MOSFETs $PY_{11}$ to $PY_{31}$ turn off. Thus, the low level 0 V of the non-selected column decoder outputs $Y_1$ to $Y_3$ are not influenced. In this state, only the N-channel MOSFET $YS_0$ in the column selector 3 turns on so that the input of the sense amplifier 10 is connected with the column line $D_0$ through this N-channel MOSFET $YS_0$. Further, the row decoder 4 and the row pull-up circuit 6, which have the same circuit arrangements as the column decoder 2 and the column pull-up circuit 5, respectively, select the row line $W_0$ to be pulled up to the high level 5 V while the non-selected $W_1$ to $W_3$ are at the low level 0 V.

In this way, the memory cell $M_{00}$ is selected. If the threshold voltage $V_{TM}$ of the selected memory cell $M_{00}$ is $V_{TM}=2$ V which has not been shifted, the memory cell $M_{00}$ turns on so that the low level is produced from the sense amplifier 10. If $V_{TM}$ of the selected memory cell $M_{00}$ is $V_{TM}=10$ V shifted, the memory cell $M_{00}$ does not turn on, but the high level is produced from the sense amplifier 10.

As readily understood from the description hitherto made, in an EPROM, it is possible to electrically store any data in any memory cell, and also possible to read the data stored in any memory cell.

Figure 2:
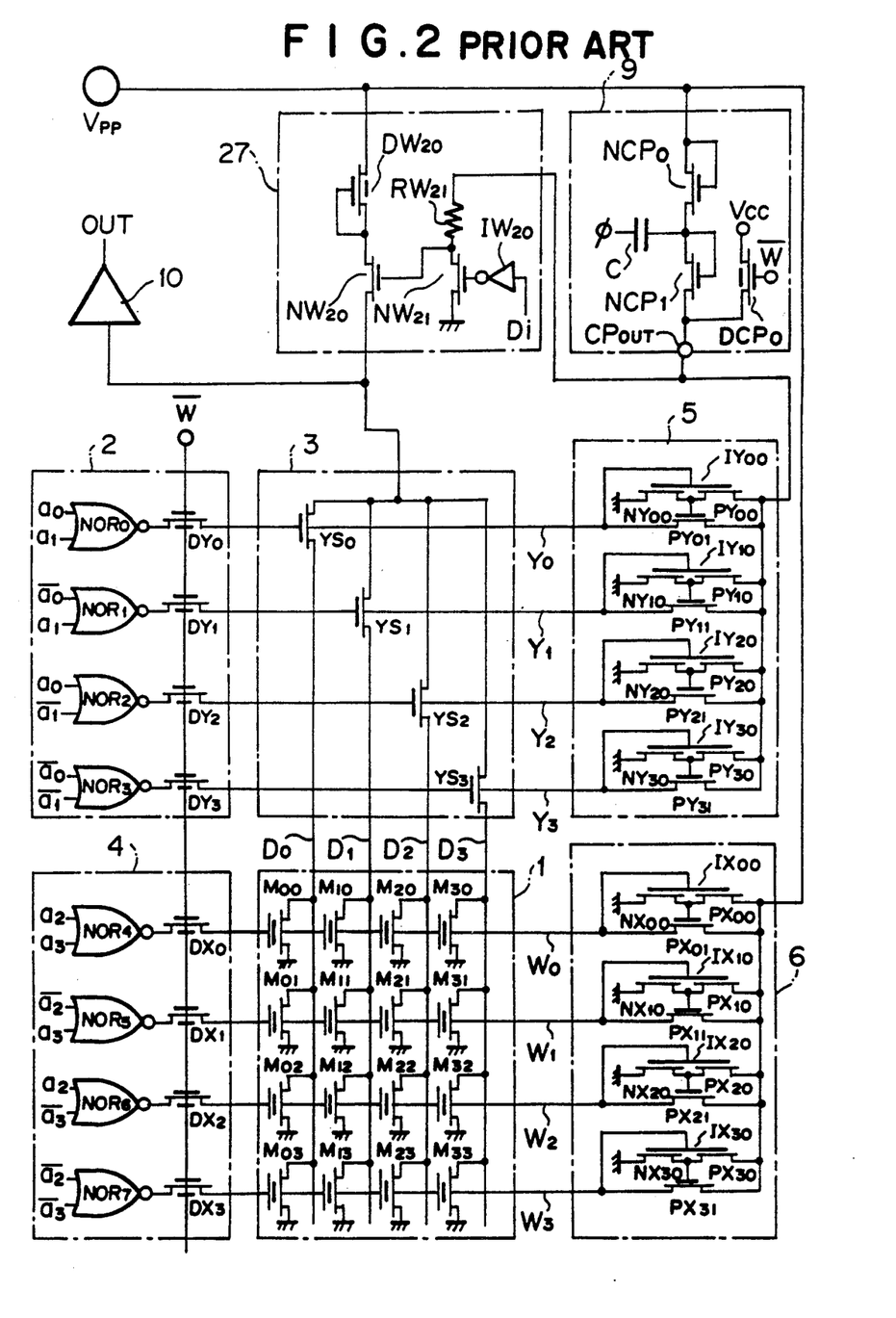

FIG. 2 shows another conventional EPROM. In FIG. 2, like reference numerals and symbols refer to like parts in FIG. 1. It should be noted that the EPROM of FIG. 2 comprises a voltage boosting circuit 9 in addition to the components as shown in FIG. 1 and the write circuit 17 in FIG. 1 is modified as a write circuit 27.

Specifically, the voltage boosting circuit 9 is composed of N-channel MOSFETs $NCP_0$ and $NCP_1$ which are connected in series between the write voltage terminal $V_{PP}$ and an output terminal $CP_{OUT}$ of the voltage boosting circuit and the gate electrodes of which are connected with the corresponding drain electrodes; a capacitor element C one terminal of which is connected with the junction point of $NCP_0$ and $NCP_1$ and the other terminal of which a clock signal $\phi$ is applied to; and an N-channel depletion type MOSFET $DCP_0$ the drain electrode of which is connected with a power supply voltage terminal $V_{CC}$, the source electrode of which is connected with the output terminal $CP_{OUT}$ of the voltage boosting circuit 9 and the gate electrode of which the write signal $\overline{W}$ is applied to.

The write circuit 27 is composed of an N-channel depletion type MOSFET $DW_{20}$ and an N-channel MOSFET $NW_{20}$ connected in series between the write voltage terminal $V_{PP}$ and the column selector 3; a load element $RW_{21}$ and an N-channel MOSFET $NW_{21}$ connected in series between the output terminal $CP_{OUT}$ of the voltage boosting circuit 9 and the ground. The gate electrode of the MOSFET $NW_{21}$ receives a signal obtained by inverting the write data $D_1$ by an inverter $IW_{20}$. The gate electrode of the MOSFET $DW_{20}$ is connected with its source electrode and the gate electrode of the N-channel MOSFET $NW_{20}$ is connected with the junction point of the load element $RW_{21}$ and the N-channel MOSFET $NW_{21}$. Further, it should be noted that the output terminal $CP_{out}$ of the voltage boosting circuit 9 is also connected with each of the source electrodes of the P-channel MOSFETs $PY_{00}$-$PY_{30}$ constituting the inverters $IY_{00}$-$IY_{30}$ and of the P-channel MOSFETs $PY_{01}$-$PY_{31}$ all in the column pull-up circuit 5.

The write operation of the EPROM of FIG. 2 will be explained. With the write voltage terminal $V_{pp}$ set for the high voltage 12.5 V and the write signal $\overline{W}$ set for the low level 0 V, if the clock signal $\phi$ is applied to the voltage boosting circuit 9, the voltage $V_{cp}$ (e.g., $V_{cp}=20$ V) boosted by the voltage boosting circuit 9 will be produced from its output terminal $CP_{out}$. If the address signals of $a_0=0$, $a_1=0$, $a_2=0$ and $a_3=0$ are applied, as described in connection with FIG. 1, the decoder output $Y_0$ is selected and then pulled up to $|V_{TD}|=3$ V. Further, the output of the inverter $IY_{00}$ in the column pull-up circuit 5 becomes the low level 0 V, so that the P-channel MOSFET $PY_{01}$ turns on. Thus, the selected decoder output $Y_0$ will be pulled up to the boosted voltage ($V_{CP}=20$ V) produced from the output terminal $CP_{OUT}$ of the boosting circuit 9 through the P-channel MOSFET $PY_{01}$. Accordingly, the boosted voltage $V_{CP}=20$ V is applied to the gate electrode of the N-channel MOSFET $YS_0$ so that it turns on. As a result, the column line $D_0$ is connected with the write circuit 27.

Further, as described in connection with FIG. 1, the row decoder 4 and the row pull-up circuit 6 select the row line $W_0$ to be pulled up to the high voltage $V_{PP}=12.5$ V. In this way, the memory cell $M_{00}$ in the memory cell array is selected.

Now, if the write data $D_1$ is at a high level, the output from the inverter $IW_{20}$ becomes a low level 0 V. Then, the N-channel MOSFET $NW_{21}$ turns off, so that the potential at the junction point of the load element $RW_{21}$ and the N-channel MOSFET $NW_{21}$ connected in series between the terminal $CP_{OUT}$ and the ground becomes the boosted voltage $V_{CP}=20$ V produced from the voltage boosting circuit 9. Thus, the boosted voltage $V_{CP}=20$ V is applied to the gate electrode of the N-channel MOSFET $NW_{20}$, so that $NW_{20}$ turns on. Accordingly, the drain electrode of the memory cell $M_{00}$ is connected with the write voltage terminal $V_{PP}$ through the N-channel MOSFET $NW_{20}$ and the N-channel depletion type MOSFET $DW_{20}$ in the write circuit 27 and the N-channel MOSFET $YS_0$ in the column selector 3. As a result, the threshold voltage $V_{TM}$ of the memory cell $M_{00}$ will be shifted e.g., from $V_{TM}=2$ V to $V_{TM}=10$ V.

Figure 3B:
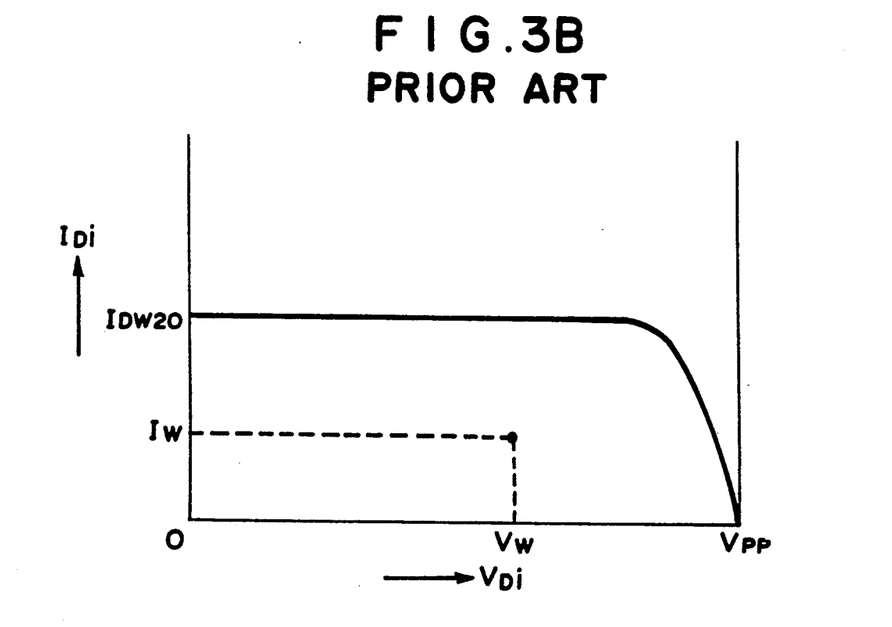

Now, FIG. 3B shows the load line obtained with the potential $V_{D1}$ of the selected column line and the current $I_{D1}$ flowing through MOSFETs $DW_{20}$ and $NW_{20}$ in the write circuit 27 and the MOSFET $YS_0$ in the column selector 3. Now it should be noted that the boosted voltage $V_{CP}=20$ V is previously applied to the gate electrode of the N-channel MOSFET $NW_{20}$ in the write circuit 27 and that of the N-channel MOSFET $YS_0$ in the column selector 3. For this reason, if the threshold voltages $V_{TN}$ of the N-channel MOSFETs $NW_{20}$ and $YS_0$ are $V_{TN}=1$ V, respectively, even if the $V_{PP}=12.5$ V is applied to their source electrodes, they are not cut off. As a result, the load line is determined by the N-channel depletion type MOSFET $DW_{20}$ and the current $I_{D1}$ flows when $0 \leq V_{D1} < V_{PP}$. The current $I_{D1}$ will be limited by $I_{DW20}$ expressed by the following equation:

$$I_{DW20} = \tfrac{1}{2} \beta_{DW20} (V_{TDW20})^2 \quad (1)$$

In Equation (1), $\beta_{DW20}$ and $V_{TDW20}$ are $\beta$ and the threshold voltage of the N-channel MOSFET $DW_{20}$, and the limit current $I_{DW20}$ can be defined by setting $\beta_{DW20}$ and $V_{TDW20}$. In this case also, it should be noted that in order to shift the threshold voltage $V_{TM}$ of the memory cell, the load line must be set at the upper right of the write starting point (represented by ".") given by $V_W$ and $I_W$.

On the other hand, if the write data $D_1$ is the low level, the output from the inverter $IW_{20}$ becomes the high level, so that the N-channel MOSFET $NW_{21}$ turns on. Thus, the junction point of the load element $RW_{21}$ and the MOSFET $NW_{21}$ becomes the low level so that the MOSFET $NW_{20}$ turns off. Then, no voltage is applied to the drain electrode of the selected memory cell $M_{00}$ so that the memory cell $M_{00}$ is in a non-writing state. Therefore, $V_{TM}$ thereof is not shifted but $V_{TN}=2$ V is maintained. Additionally, in the read-out operation, the write voltage terminal $V_{PP}$ is set for the power supply voltage $V_{CC}=5$ V and the write signal $\overline{W}$ is set for the high level $V_{CC}=5$ V. In this case, the N-channel MOSFET $DCP_0$ turns on so that the voltage of $V_{CC}=5$ V is extracted from the output terminal $CP_{OUT}$ of the voltage boosting circuit 9. Therefore, the read operation can be executed in the same manner as in the EPROM shown in FIG. 1.

The prior art EPROMs described above have the following defects.

In the prior art EPROM shown in FIG. 1, as the load line of the write circuit 17 has the characteristic as shown in FIG. 3A, if the load line is so set that it starts from $V_{PP}-V_{TN}$ and passes the upper right of the write starting point (represented by ".") in order to shift the threshold voltage $V_{TM}$ of the memory cell, the current $I_{D1}$ in the range of $V_{D1} < V_W$ becomes very large.

Also, as the current $I_{D1}$ is supplied from the write voltage terminal $V_{PP}$, if $V_{D1}$ becomes low, the current (hereinafter referred to as "$I_{PP}$") flowing from the write voltage terminal $V_{PP}$ also becomes very large.

On the other hand, in the prior art EPROM shown in FIG. 2, the load line of the write circuit 27 has the characteristic as shown in FIG. 3B. As described above, $I_{D1}$ is limited by $I_{DW20}$ so that $I_{PP}$ does not become large. However, in the range of $I_{D1}$ is small, that is, $I_{D1} << I_W$, $V_{D1}$ becomes a high voltage which is substantially equal to $V_{PP}$. Thus, the high voltage which is substantially equal to $V_{PP}$ will be applied to the drain electrode of a memory cell. Application of such a high voltage to the drain electrode of the memory cell may break the memory cell, or cause the data stored in the memory cell to disappear, thereby greatly deteriorating the reliability of the memory cell.

In this way, the setting $I_{D1}$ and $V_{D1}$ in an EPROM is a very important matter. Nevertheless, both the prior art EPROMs could not have these values set in a desired manner.

SUMMARY OF THE INVENTION

It is, therefore, an object of the invention to overcome the problems existing in the conventional EPROM and to provide an improved semiconductor storage device.

It is another object of the invention to provide an EPROM which can prevent an excess current from flowing through each of memory cells and an excess voltage from being applied to the drain of the memory cell, thereby enhancing the reliability of the memory cell.

It is a further object of the invention to provide an EPROM with a reduced wiring area so as to be integrated at a high integration density.

In accordance with one aspect of the invention, there is provided a semiconductor storage device which comprises:

a memory cell array including a plurality of memory cells each having a floating gate arranged in a row and a column direction;

a plurality of column lines for connecting the memory cells in the column direction;

a plurality of row lines for connecting the memory cells in the row direction;

a column decoder for receiving a first address signal related to the column direction;

a column selector for selecting the column lines, the column selector being driven by outputs from the column decoder;

a row decoder for receiving a second address signal related to the row direction and selecting the row lines;

a voltage dividing circuit connected between a write voltage terminal and ground;

a sense amplifier for reading the data stored in the memory cells; and at least one write circuit for applying a high voltage to one column line selected from the plurality of column lines in accordance with a write data, the high voltage being supplied from the write voltage terminal, when writing for one memory cell selected from the plurality of memory cells, the write circuit comprising a first MOSFET having a first conductivity type and a second MOSFET having a second conductivity type opposite to the first conductivity type connected in series between the write voltage terminal and the column selector in which the first MOSFET turns on when a reference voltage is applied to its gate electrode in accordance with the write data, and the second MOSFET turns on when an output voltage from the voltage dividing circuit is applied to its gate electrode.

PREFERRED EMBODIMENTS OF THE INVENTION

Now, referring to the drawings, an explanation will be given of embodiments of the present invention.

Figure 4:
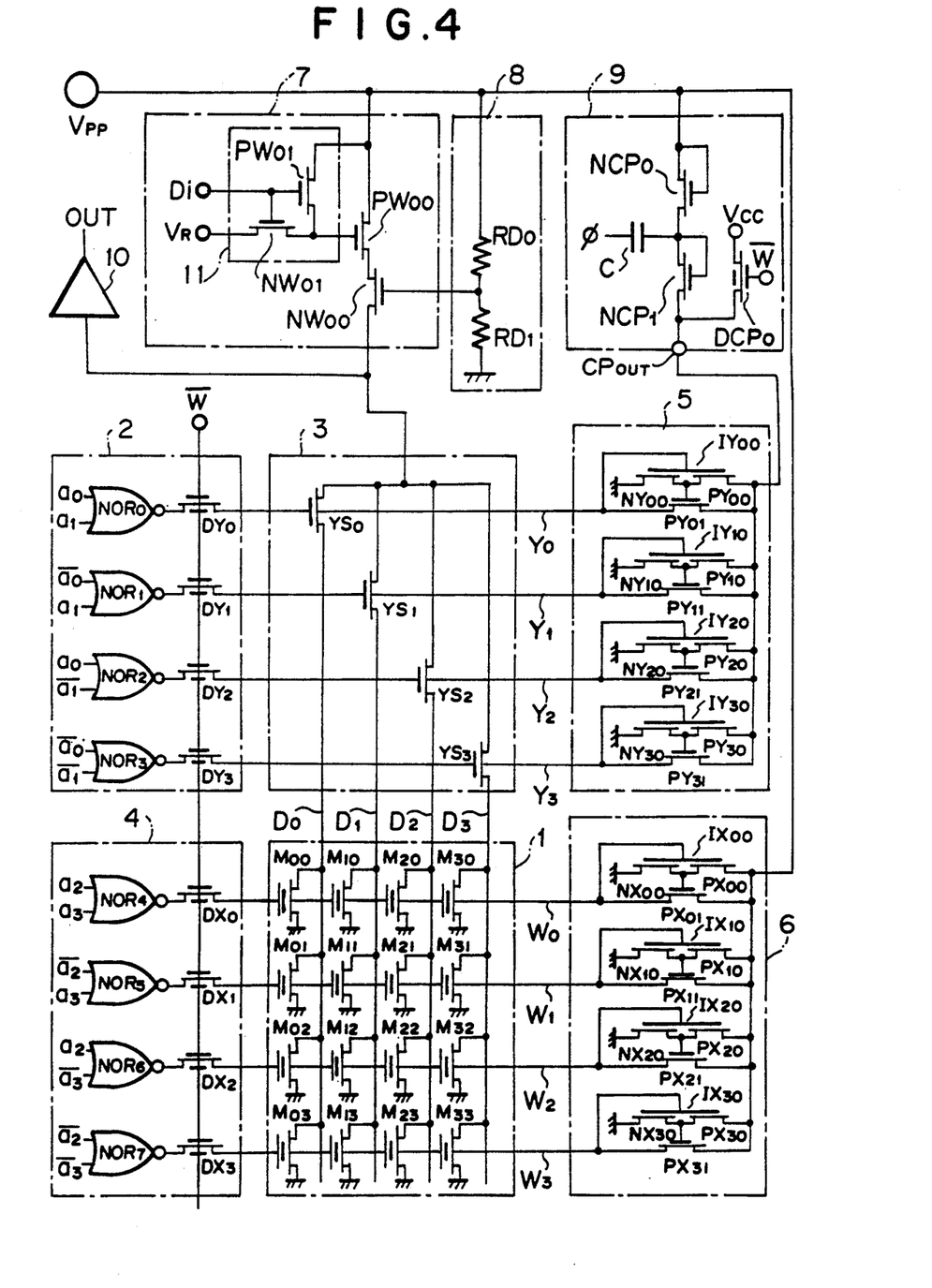
FIG. 4 is a circuit diagram of an EPROM of a first embodiment according to the present invention.

FIG. 4 shows an EPROM of a first embodiment according to the present invention.

As shown in FIG. 4, the EPROM is composed of a memory cell array 1, a plurality of column lines $D_0-D_3$, a plurality of row lines $W_0-W_3$, a column decoder 2, a column selector 3, a row decoder 4, a column pull-up circuit 5, a row pull-up circuit 6, a voltage boosting circuit 9, a voltage dividing circuit 8, a write circuit 7 and a sense amplifier 10.

Specifically, the memory cell array 1 comprises a plurality of electrically erasable programmable memory cells $M_{00}-M_{33}$ each having a floating gate arranged in a matrix configuration. The column lines $D_0-D_3$ serve to connect the memory cells $M_{00}-M_{33}$ in the column direction. The row lines $W_0-W_3$ serve to connect the memory cells $M_{00}-M_{33}$ in the row direction. The column decoder 2 is composed of NOR gates $NOR_0-NOR_3$ having inputs of address signals $a_0-a_1$, and transfer gates constituted by N-channel depletion type MOSFETs $DY_0-DY_3$ to each of the gates of which a write signal $\overline{W}$ is commonly applied. The column selector 3 is composed of N-channel MOSFETs $YS_0-YS_3$ which are driven by the outputs $Y_0-Y_3$ from the column decoder 2 and serve to select the column lines $D_0-D_3$. The row decoder 4 is composed of NOR gates $NOR_4-NOR_7$ having inputs of address signals $a_2-a_3$, and transfer gates constituted by N-channel depletion type MOSFETs $DX_0-DX_3$ to each of the gates of which a write signal $\overline{W}$ is commonly applied, and serve to select the row lines $W_0-W_3$.

The column pull-up circuit 5 is composed of inverters $IY_{00}-IY_{30}$ and P-channel MOSFETs $PY_{01}-PY_{31}$. The inverters $IY_{00}-IY_{30}$ comprise P-channel MOSFETs $PY_{00}-PY_{30}$ and N-channel MOSFETs $NY_{00}-NY_{30}$ which are connected in series between the output terminal $CP_{out}$ of the voltage boosting circuit 9 and the ground, and their inputs are connected with the output $Y_0-Y_3$ from the column decoder 2. The P-channel MOSFETs $PY_{01}-PY_{31}$ are connected between the output terminal $CP_{out}$ of the voltage boosting circuit 9 and the outputs $Y_0-Y_3$ from the column decoder 2, and applied to their gate electrodes are the outputs from the inverters $IY_{00}-IY_{30}$.

The row pull-up circuit 6 is composed of inverters $IX_{00}-IX_{30}$ and P-channel MOSFETs $PX_{01}-PX_{31}$. The inverters $IX_{00}-IX_{30}$ comprise P-channel MOSFETs $PX_{00}-PX_{30}$ and N-channel MOSFETs $NX_{00}-NX_{30}$ which are connected in series between a write voltage terminal $V_{PP}$ and the ground, and their inputs are connected with the row lines $W_0-W_3$. The P-channel MOSFETs $PX_{01}-PX_{31}$ are connected between the write voltage terminal $V_{PP}$ and the row lines $W_0-W_3$, and applied to their gate electrodes are the outputs from the inverters $IX_{00}-IX_{30}$.

The voltage boosting circuit 9 is composed of N-channel MOSFETs $NCP_0$ and $NCP_1$ which are connected in series between the write voltage terminal $V_{PP}$ and its output terminal $CP_{out}$ and the gate electrodes of which are connected with the corresponding drain electrodes; a capacitor element C one terminal of which is connected with the junction point of the MOSFETs $NCP_0$ and $NCP_1$ and the other terminal of which a clock signal $\phi$ is applied to; and an N-channel depletion type MOSFET $DCP_0$ the drain electrode of which is connected with a power supply voltage terminal $V_{cc}$, the source electrode of which is connected with the output terminal $CP_{OUT}$ of the voltage boosting circuit 9 and the gate electrode of which the write signal $\overline{W}$ is applied to.

The voltage dividing circuit 8 is composed of a resistor elements $RD_0$ and $RD_1$ connected in series between the write voltage terminal $V_{PP}$ and the ground.

The write circuit 7 is composed of a P-channel MOSFET $PW_{00}$ and an N-channel MOSFET $NW_{00}$ connected in series between the write voltage terminal $V_{PP}$ and the column selector 3; and a switch circuit 11 comprising a P-channel MOSFET $PW_{01}$ the source electrode of which is connected with the write voltage terminal $V_{PP}$, the drain electrode of which is connected with the gate electrode of the P-channel MOSFET $PW_{00}$ and the gate electrode of which a write data $D_1$ is applied to, and an N-channel MOSFET $NW_{01}$ the drain electrode of which a reference voltage $V_R$ is applied to, the gate electrode of which the write data $D_1$ is applied to and the source electrode of which is connected with the gate electrode of the P-channel MOSFET $PW_{00}$. The gate electrode of the N-channel MOSFET $NW_{00}$ is connected with the junction point of the resistor elements $RD_0$ and $RD_1$ constituting the voltage dividing circuit 8.

The sense amplifier 10 serves to read the data stored in the memory cells $M_{00}-M_{33}$.

The write operation of the EPROM of FIG. 4 will be explained. With the write voltage terminal $V_{PP}$ set for the high voltage 12.5 V and the write signal set for the low level 0 V is applied, if the clock signal $\phi$ is applied to the voltage boosting circuit 9, the voltage $V_{CP}$ (e.g., $V_{CP}=20$ V) boosted by the voltage boosting circuit 9 will be produced from its output terminal $CP_{OUT}$. If the address signals of $a_0=0$, $a_1=0$, $a_2=0$ and $a_3=0$ are applied, as described in connection with FIG. 1, the decoder output $Y_0$ is selected and then pulled up to $|V_{TD}|=3$ V through the MOSFET $DY_0$. Further, the output $IY_{00}$ in the column pull-up circuit 5 becomes the low level 0 V so that the P-channel MOSFET $Y_{01}$ turns on. Thus, the selected decoder output $Y_0$ will be pulled up to the boosted voltage ($V_{CP}=20$ V) outputted from the output terminal $CP_{OUT}$ of the voltage boosting circuit 9 through the P-channel MOSFET $PY_{01}$. Accordingly, the boosted voltage $V_{CP}=20$ V is applied to the gate electrode of the N-channel MOSFET $YS_0$ so that it turns on. As a result, the column line $D_0$ is connected with the write circuit 7.

Further, as described in connection with FIG. 1, the row decoder 4 and the row pull-up circuit 6 select the row line $W_0$ and this row line $W_0$ is pulled up to the high voltage $V_{PP}=12.5$ V. In this way, the memory cell $M_{00}$ is selected.

Now, if the write data $D_1$ is at a high level $V_{PP}=12.5$ V in the write circuit 7, in the switch circuit 11, the P-channel MOSFET $PW_{01}$ turns off and the N-channel MOSFET $NW_{01}$ turns on. Thus, the reference voltage $V_R$ is applied to the gate electrode of the P-channel MOSFET $PW_{00}$. Also applied to the gate electrode of the N-channel MOSFET $NW_{00}$ is the output voltage $V_{DC}$ from the voltage dividing circuit 8 expressed by the following equation:

$$V_{DC} = \frac{RD_1}{RD_0 + RD_1} \cdot V_{PP} \quad (2)$$

Figure 5:
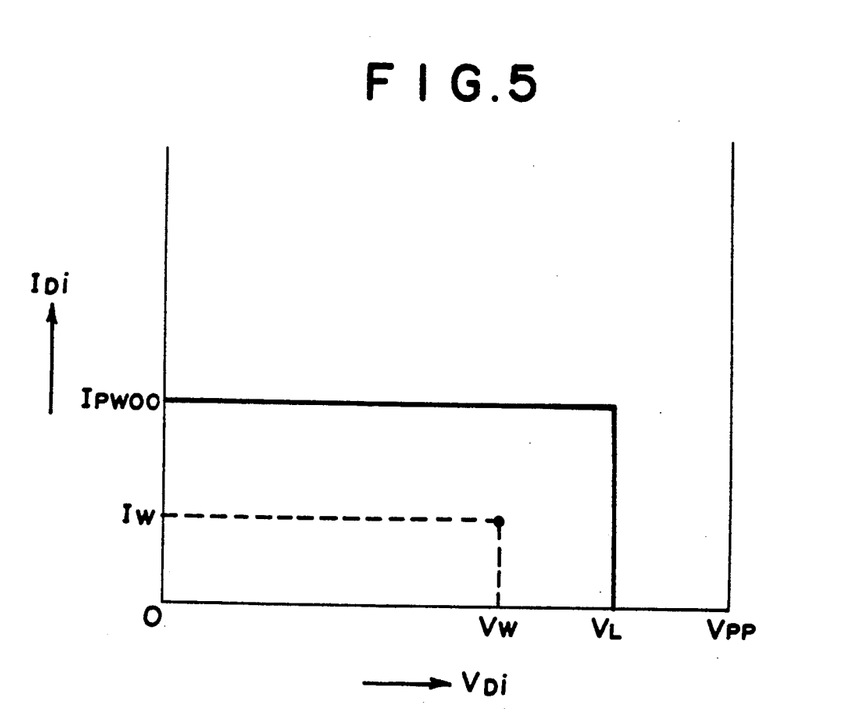
FIG. 5 is a graph of the characteristic of the load line in the circuit shown in FIG. 4.

Now, FIG. 5 shows the load line obtained with the potential $V_{D1}$ of the selected column line and the current $I_{D1}$ flowing through the MOSFETs $PW_{00}$ and $NW_{00}$ in the write circuit 7 and the MOSFET $YS_0$ in the column selector 3. Now it should be noted that the boosted voltage $V_{CP}=20$ V is previously applied to the gate electrode of the N-channel MOSFET $YS_0$ in the column selector 3. For this reason, if the threshold voltage $V_{TN}$ of the N-channel MOSFET $YS_0$ is $V_{TN}=1$ V, even if the $V_{PP}=12.5$ V is applied to its source electrode, it is not cut off. As a result, the load line is determined by the P-channel MOSFET $PW_{00}$ and the N-channel MOSFET $NW_{00}$ in the write circuit 7. As shown in FIG. 4, as the reference voltage $V_R$ is applied to the gate electrode of the P-channel MOSFET $PW_{00}$, the current $I_{D1}$ will be limited by $I_{PW00}$ expressed by the following equation:

$$I_{PW00} = \tfrac{1}{2} \beta_{PW00}(V_{PP} - V_R - |V_{TPW00}|)^2 \quad (3)$$

where $\beta_{PW00}$ is $\beta$ of the P-channel MOSFET $PW_{00}$, and $V_{TPW00}$ is the threshold voltage of the P-channel MOSFET $PW_{00}$.

Further, the output divided voltage $V_{DC}$ given by Equation (2) is applied to the gate electrode of the N-channel MOSFET $NW_{00}$, $V_{D1}$ will be limited by $V_L$ expressed by the following equation:

$$\begin{aligned} V_L &= V_{DC} - V_{TNW00} \\ &= \frac{RD_1}{RD_0 + RD_1} \cdot V_{PP} - V_{TNW00} \end{aligned} \quad (4)$$

where $V_{TNW00}$ is the threshold voltage of the N-channel MOSFET $NW_{00}$.

As apparent from Equation (3), the limited current $I_{PW00}$ can be determined by setting $\beta_{PW00}$ and $V_{TPW00}$, and as apparent from Equation (4), the limited voltage $V_L$ can be determined by setting $RD_0$, $RD_1$ and $V_{TNW00}$. This permits any load line to be set.

As seen from FIG. 5, in this case also, it should be noted that in order to shift the threshold voltage $V_{TM}$ of the memory cell, the load line must be set at the upper right of the write starting point (represented by ".") defined by $V_W$ and $I_W$.

On the other hand, if the write data $D_1$ is the low level 0 V, in the switch circuit 11, the P-channel MOSFET $PW_{01}$ turns on and the N-channel MOSFET $NW_{01}$ turns off. Then, the voltage $V_{PP}=12.5$ V of the write voltage terminal $V_{PP}$ is applied to the gate electrode of the P-channel MOSFET $PW_{00}$ so that $PW_{00}$ turns off. Thus, no voltage is applied to the drain electrode of the selected memory cell $M_{00}$, so that the memory cell $M_{00}$ is in a non-writing state. Therefore, $V_{TM}$ thereof is not shifted but $V_{TN}=2$ V is maintained.

The read operation, which can be executed in the same manner as the prior art EPROM of FIG. 2, is not explained here.

Figure 6:
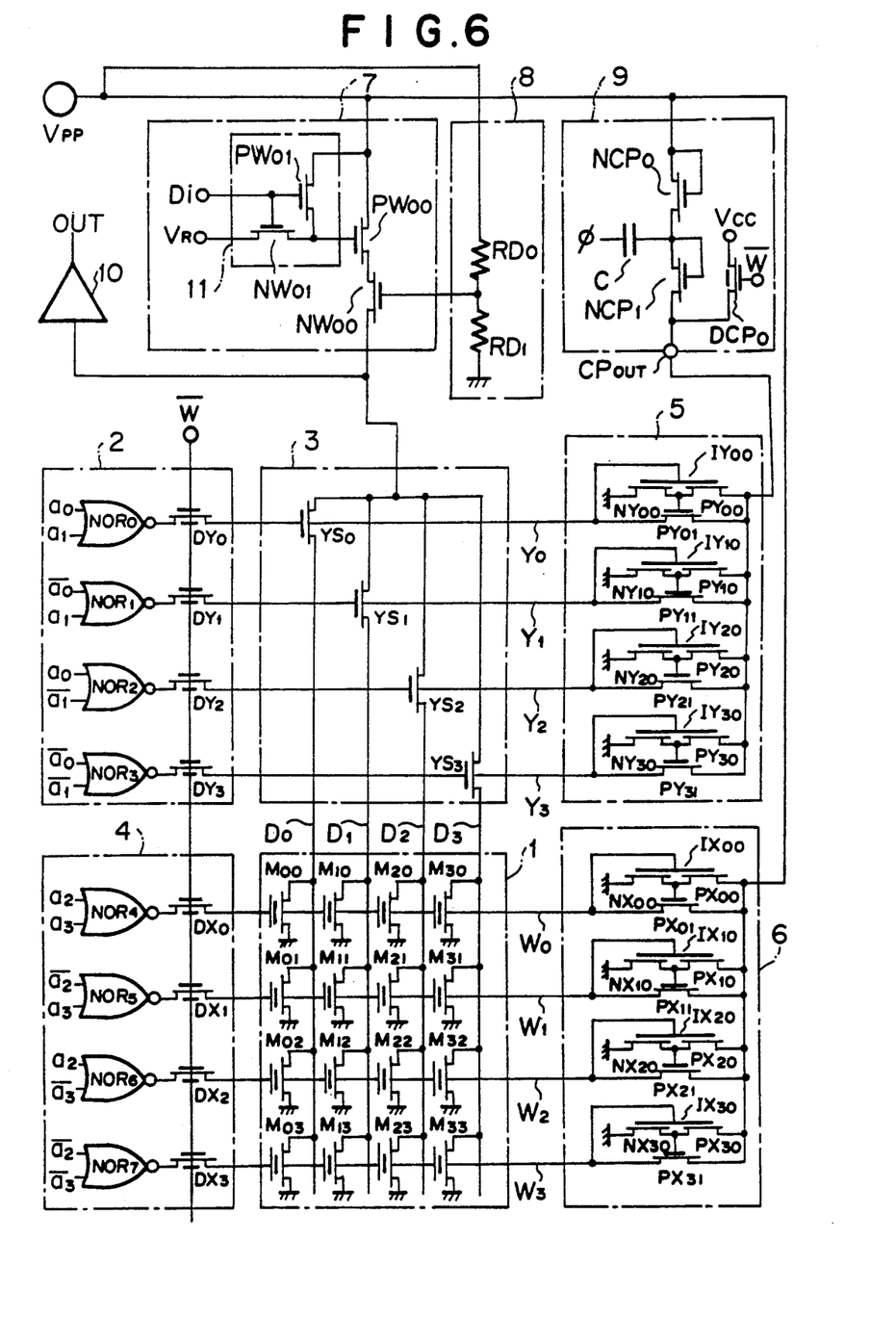
FIG. 6 is a circuit diagram of an EPROM of a second embodiment according to the present invention.

FIG. 6 shows an EPROM of a second embodiment according to the present invention. In FIG. 6, like reference numerals and symbols refer to like parts in FIG. 4. This embodiment is different from that of FIG. 4 in that the wiring for connecting the write circuits 7 with the write voltage terminal $V_{PP}$ is separated from that for connecting the voltage dividing circuit 8 with the write voltage terminal $V_{PP}$. The write and read operations in this embodiment, which can be executed in the same manner as in the first embodiment, are not explained here.

Figure 7A:
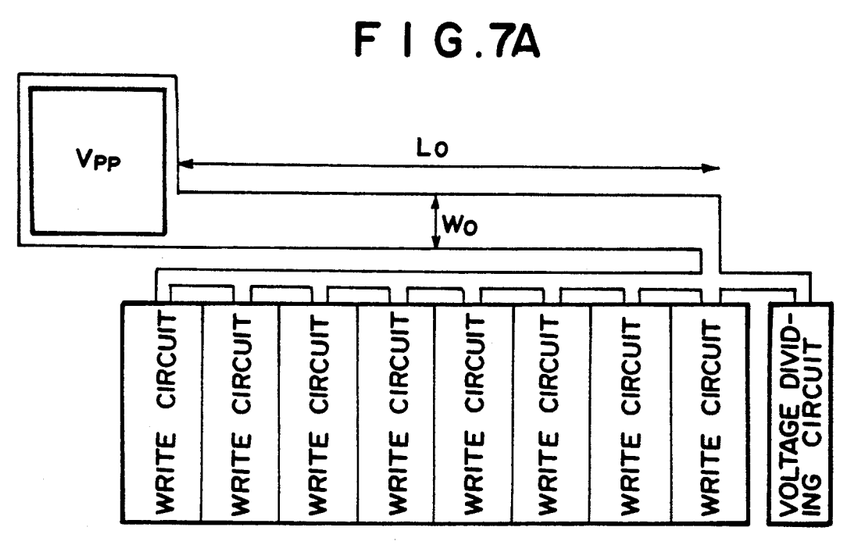
FIGS. 7A and 7B are conceptual views of a wiring pattern used in the EPROMs of FIGS. 4 and 5.
Figure 7B:
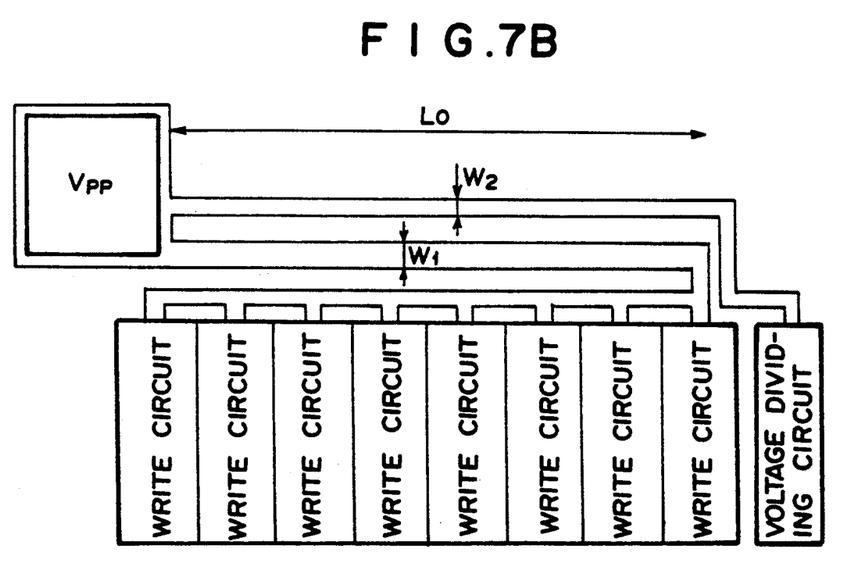

The wiring pattern in this embodiment will be compared with that in the first embodiment of FIG. 4 with reference to FIGS. 7A and 7B. FIG. 7A shows the wiring pattern in which the write circuits and the voltage dividing circuit are connected with the write voltage terminal $V_{PP}$ using the same wiring having a width of $W_0$ and a length of $L_0$. FIG. 7B shows the wiring pattern in which the write circuits are connected with the write voltage terminal $V_{PP}$ using a first wiring having a width of $W_0$ and a length of $L_0$ and the voltage dividing circuit is connected with the write voltage terminal using a second wiring having a width of $W_2$ and a length of $L_0$ separated from the first wiring.

In FIGS. 7A and 7B, eight (8) write circuits are shown for the EPROM in which one word is composed of eight (8) bits. Not shown are the memory cell array, the column decoder, the column selector, the row decoder, the column pull-up circuit, the row pull-up circuit, the voltage boosting circuit and the sense amplifier. The wirings for connecting the write voltage terminal with the write circuits and the voltage dividing circuit have wiring resistance. If in writing, a current $I_{WC}$ (e.g., $I_{WC}=2$ mA) flows to the write circuits and a current $I_{DC}$ (e.g., $I_{DC}=0.1$ mA) flows to the voltage dividing circuit, the voltage drops due to the wiring resistance will be developed.

The wiring resistance $R_1$ can be given by Equation (5). So, the voltage drop $(\Delta V_{PP})a$ due to the wiring resistance in FIG. 7A can be expressed by Equation (6). The voltage drops $(\Delta V_{PP})b1$ and $(\Delta V_{PP})b2$ due to the first wiring resistance and the second wiring resistance in FIG. 7B can be expressed by Equations (7-1) and (7-2), respectively.

$$R_1 = \frac{L_1}{W_1} P_S \quad (5)$$

where $P_S$ is sheet resistance of a wiring material used.

$$(\Delta V_{PP})a = (8 \times I_{WC} + I_{DC}) \times \frac{L_0}{W_0} P_S \quad (6)$$

$$(\Delta V_{PP})b1 = (8 \times I_{WC}) \times \frac{L_0}{W_1} P_S \quad (7\text{-}1)$$

$$(\Delta V_{PP})b2 = I_{DC} \frac{L_0}{W_2} P_S \quad (7\text{-}2)$$

Now it should be noted that the limited voltage $V_L$ given by Equation (4) of the load line depends on the output voltage $V_{DC}$ given by Equation (2) and sent from the voltage diving circuit 8, and this output voltage $V_{DC}$ depends on the voltage $V_{PP}$ applied to the voltage dividing circuit. For this reason, if the voltage applied to the voltage dividing circuit goes down by the voltage drop due to the wiring resistance, the limited voltage of the load line will also lower so that the voltage drop due to the wiring resistance should be made small.

Now, the wiring widths $W_0$ and $W_2$ required in order to decrease $(\Delta V_{PP})a$ and $(\Delta V_{PP})b2$ to 0.5 V or less will be calculated using Equations (6) and (7-2).

$$W_0 = \frac{(8 \times I_{WC} + I_{DC}) \times L_0 \times P_S}{(\Delta V_{PP})a} \quad (8)$$

$$= \frac{(8 \times 2^m + 0.1^m) \times L_0 \times P_S}{0.5}$$

$$= 32.2^m \times L_0 \times P_S$$

$$W_2 = \frac{I_{DC} \times L_0 \times P_S}{(\Delta V_{PP})b2} \quad (9\text{-}2)$$

$$= \frac{0.1^m \times L_0 \times P_S}{0.5}$$

$$= 0.2^m \times L_0 \times P_S$$

With the limited voltage $V_L$ of the load line set for $V_L = 8$ V, the write circuit is operable when the voltage (i.e., 10 V or so) which is higher than the limited voltage by 2 V or so. With $V_{PP} = 12.5$ V, if $(\Delta V_{PP})b1$ is not smaller than 2.5 V, the voltage of 10 V or larger can be applied to the write circuit. So, the wiring width required to make $(\Delta V_{PP})b1$ be 2.5 V or less will be calculated by using Equation (7-1).

$$W_1 = \frac{(8 \times I_{WC}) \times L_0 \times P_S}{(\Delta V_{PP})b1} \quad (9\text{-}1)$$

$$= \frac{(8 \times 2^m) \times L_0 \times P_S}{2.5}$$

$$= 6.4^m \times L_0 \times P_S$$

Accordingly, the width of the wiring required in the case of connecting the write voltage terminal $V_{PP}$ with the write circuits and the voltage dividing circuit using the same wiring as shown in FIG. 7A is given by $W_0$ of Equation 8. On the other hand, the widths of the wirings in the case of the write voltage terminal $V_{PP}$ with the write circuits and the voltage dividing circuit using individual wirings separated from each other are given by $W_1$ of Equation (9-1) and $W_2$ of Equation (9-2). The ratio of $W_0$ and $(W_1 + W_2)$ is given by:

$$\frac{W_1 + W_2}{W_0} = \frac{(6.4^m \times L_0 \times P_S) + (0.2^m \times L_0 \times P_S)}{32.2^m \times L_0 \times P_S}$$

$$\approx 0.2$$

Therefore, by separating the wiring for connecting the write voltage terminal with the write circuits and the wiring for connecting the former with the voltage dividing circuit, the entire wiring width, i.e., the area of the wiring region can be reduced to 1/5.

In accordance with the present invention, in writing for a memory cell, the MOSFETs constituting the write circuit can be controlled by a reference voltage and the output from a voltage dividing circuit in accordance with a write data so that the limited voltage and the limited current of the load line can be set as desired. This prevents an excess current from being supplied to the drain electrode of a memory cell so that an EPROM can be fabricated without degrading the reliability of the memory cell. Further, the wirings for connecting the write voltage terminal with the write circuits and the voltage dividing circuit are individually provided or separated with each other so that the width of the wirings, i.e., the necessary wiring area can be reduced. This permits a semiconductor device (EPROM) to be integrated with high integration density.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor device comprising:
   a memory cell array including a plurality of memory cells each having a floating gate arranged in a row and a column direction;
   a plurality of column lines for connecting said memory cells in the column direction;
   a plurality of row lines for connecting said memory cells in the row direction;
   a column decoder for receiving a first address signal related to said column direction;
   a column selector for selecting said column lines, said column selector being driven by outputs from said column decoder;
   a row decoder for receiving a second address signal related to said row direction and selecting said row lines;
   a voltage dividing circuit connected between a write voltage terminal and ground;
   a sense amplifier for reading the data stored in the memory cells; and
   at least one write circuit for applying a high voltage to one column line selected from said plurality of column lines in accordance with a write data, said high voltage being supplied from said write voltage terminal, when writing for one memory cell selected from said plurality of memory cells,
   said write circuit comprising a first MOSFET having a first conductivity type and a second MOSFET having a second conductivity type opposite to said first conductivity type connected in series between said write voltage terminal and said column selector in which said first MOSFET turns on when a reference voltage is applied to its gate electrode in accordance with said write data, and said second MOSFET turns on when an output voltage from said voltage dividing circuit is applied to its gate electrode.

2. A semiconductor device according to claim 1, wherein said semiconductor device is an EPROM.

3. A semiconductor device according to claim 1, wherein said first MOSFET and said second MOSFET included in said write circuit are a P-channel MOSFET and an N-channel MOSFET, respectively.

4. A semiconductor device according to claim 1, wherein said voltage dividing circuit is composed of resistors connected in series between said write voltage terminal and ground, and the gate of said second MOSFET is connected with a junction point of said resistors.

5. A semiconductor device according to claim 1, wherein said write circuit further comprises a switch circuit for on-off controlling said first MOSFET.

6. A semiconductor device according to claim 2, wherein the number of said write circuit is set in accordance with the number of bits of one word used for said EPROM.

7. A semiconductor device according to claim 1, wherein a wiring for connecting said write voltage terminal with said write circuit is separated from another wiring for connecting said write voltage terminal with said voltage dividing circuit.

* * * * *